(12) United States Patent
Kim

(10) Patent No.: US 7,477,528 B2
(45) Date of Patent: Jan. 13, 2009

(54) FRAME BRACKET FOR PRINTED BOARD ASSEMBLY AND PLASMA DISPLAY DEVICE HAVING THE SAME

(75) Inventor: Jae-Gyoung Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 481 days.

(21) Appl. No.: 11/253,652

(22) Filed: Oct. 20, 2005

(65) Prior Publication Data

US 2006/0089023 A1    Apr. 27, 2006

(30) Foreign Application Priority Data

Oct. 27, 2004    (KR)    ............... 10-2004-0086208

(51) Int. Cl.
*H02B 1/01*    (2006.01)
(52) U.S. Cl. ............... 361/825; 361/752; 361/753; 361/756; 361/758
(58) Field of Classification Search ............... 361/825, 361/752, 753, 756, 758
See application file for complete search history.

(56) References Cited

U.S. PATENT DOCUMENTS

| | | | | |
|---|---|---|---|---|
| 2,804,321 A | * | 8/1957 | Walker | ............... 403/40 |
| 5,712,451 A | * | 1/1998 | Lee | ............... 177/210 C |
| 6,411,359 B1 | * | 6/2002 | Kobayashi et al. | ............ 349/149 |
| 6,522,553 B2 | * | 2/2003 | Hardin et al. | ............... 361/756 |
| 6,811,028 B2 | * | 11/2004 | Kim et al. | ............... 206/587 |
| 7,147,685 B2 | * | 12/2006 | Lee | ............... 55/467 |
| 2002/0014840 A1 | * | 2/2002 | Kaneko et al. | ............... 313/587 |
| 2002/0159240 A1 | * | 10/2002 | Watanabe et al. | ............ 361/752 |
| 2003/0169573 A1 | * | 9/2003 | Irie et al. | ............... 361/752 |
| 2004/0195969 A1 | * | 10/2004 | Kim et al. | ............... 313/583 |
| 2005/0243526 A1 | * | 11/2005 | Park et al. | ............... 361/753 |
| 2006/0211300 A1 | * | 9/2006 | Kubota et al. | ............... 439/535 |
| 2008/0018822 A1 | * | 1/2008 | Yamamoto | ............... 349/58 |

* cited by examiner

*Primary Examiner*—Dean A. Reichard
*Assistant Examiner*—Xiaoliang Chen
(74) *Attorney, Agent, or Firm*—H.C. Park & Associates, PLC

(57) ABSTRACT

A frame bracket for a printed board assembly including a pair of long side parts having wall parts contacting a lower surface of a printed board assembly, a pair of short side parts forming a gap with the lower surface of the printed board assembly and extending substantially perpendicular to the long side parts, a first stud groove connecting a first long side part with a first short side part and accommodating a stud fixed on the chassis base, and a protrusion part protruding from an outer, lower surface of a long side part or a short side part to be inserted into an inserting part formed on the chassis base.

10 Claims, 3 Drawing Sheets

FRAME BRACKET FOR PRINTED BOARD ASSEMBLY AND PLASMA DISPLAY DEVICE HAVING THE SAME

CROSS-REFERENCE TO RELATED APPLICATION

This application claims priority to and the benefit of Korean Patent Application No. 10-2004-0086208, filed on Oct. 27, 2004, which is hereby incorporated by reference for all purposes as if fully set forth herein.

BACKGROUND OF THE INVENTION

1. Field of the Invention

The present invention relates to a frame bracket for a printed board assembly and a plasma display device having the same, and more particularly, to a frame bracket for mounting a printed board assembly on a chassis base.

2. Discussion of the Background

Generally, a plasma display device is a flat panel display device that displays images using a gas discharge. Due to its strong performance and characteristics, such as a high display capacity, high brightness, high contrast, clear latent image, and large viewing angle, and the fact that it is thin with a large screen size, the plasma display device is considered a replacement for the cathode ray tube (CRT). A plasma display device includes a plasma display panel (PDP), which is made of glass substrates, and a chassis base supporting the PDP.

FIG. 1 is a perspective view of a conventional plasma display device.

Referring to FIG. 1, a PDP 10 includes a front substrate 11 and a rear substrate 12, and a heat radiation sheet 14 is attached on a rear surface of the rear substrate 12. The PDP 10 is supported by a chassis base 17, which may be formed of a metal, such as aluminum. The PDP 10 is attached with the rear surface of the chassis base 17 using double sided tape 13, which extends horizontally and vertically in regions of the chassis base 17 not corresponding to the heat radiation sheet 14. Printed board assemblies 19 are mounted on the rear surface of the chassis base 17. The printed board assemblies 19 are supported by studs 21 and are spaced apart from the chassis base 17. Electronic parts 18 are mounted on the printed board assemblies 19.

Signal transmitting cables 15 connect electrodes formed on the front substrate 11 and the rear substrate 12 with electronic parts 18. The signal transmitting cable 15 may be a tape carrier package (TCP). Integrated circuit (IC) chips 20 for signal driving are mounted on the signal transmitting cables 15. The signal transmitting cables 15 are connected to connectors 23 included on buffer printed board assemblies 19a and 19b. The PDP 10 and chassis base 17 are housed in a case (not shown). The signal transmitting cables 15 are connected to the connectors 23 included in the printed board assembly 19b after passing a reinforcing member 16.

FIG. 2 is a cross-sectional view showing a printed board assembly and chassis base of FIG. 1.

Referring to FIG. 2, the stud 21 is fixed on a hole formed in the chassis base 17, and the printed board assembly 19 is supported on an upper surface of the stud 21. Screws 22, which are inserted through holes formed in the printed board assembly 19, are coupled with screw holes formed in the studs 21 to fix the printed board assembly 19 to the chassis base 17.

However, fixing the printed board assembly as described above may not easy since a plurality of studs and screws are used. Also, the screws and studs may not effectively absorb vibration or noise during the device's operation.

SUMMARY OF THE INVENTION

The present invention provides a frame bracket for mounting a printed board assembly stably.

The present invention also provides a plasma display device in which a printed board assembly is fixed using a frame bracket.

Additional features of the invention will be set forth in the description which follows, and in part will be apparent from the description, or may be learned by practice of the invention.

The present invention discloses a frame bracket for a printed board assembly. The frame bracket includes a pair of long side parts having wall parts that contact a lower surface of the printed board assembly, a pair of short side parts forming a gap with the lower surface of the printed board assembly and extending substantially perpendicular to the long side parts, a first stud groove connecting a first long side part with a first short side part, and a protrusion part protruding from an outer, lower surface of a long side part or a short side part.

The present invention also discloses a plasma display panel, a chassis base coupled with a rear surface of the plasma display panel, a frame bracket, and a printed board assembly that is electrically coupled with the plasma display panel and mounted on the frame bracket. The frame bracket includes a pair of long side parts having wall parts that contact a lower surface of the printed board assembly, a pair of short side parts that form a gap with the lower surface of the printed board assembly and extend substantially perpendicular to the long side parts, and a first stud groove connecting a first long side part with a first short side part. A first stud fixed on the chassis base is arranged in the first stud groove. A protrusion part protrudes from an outer, lower surface of a long side part or a short side part and is arranged in an inserting part formed on the chassis base.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
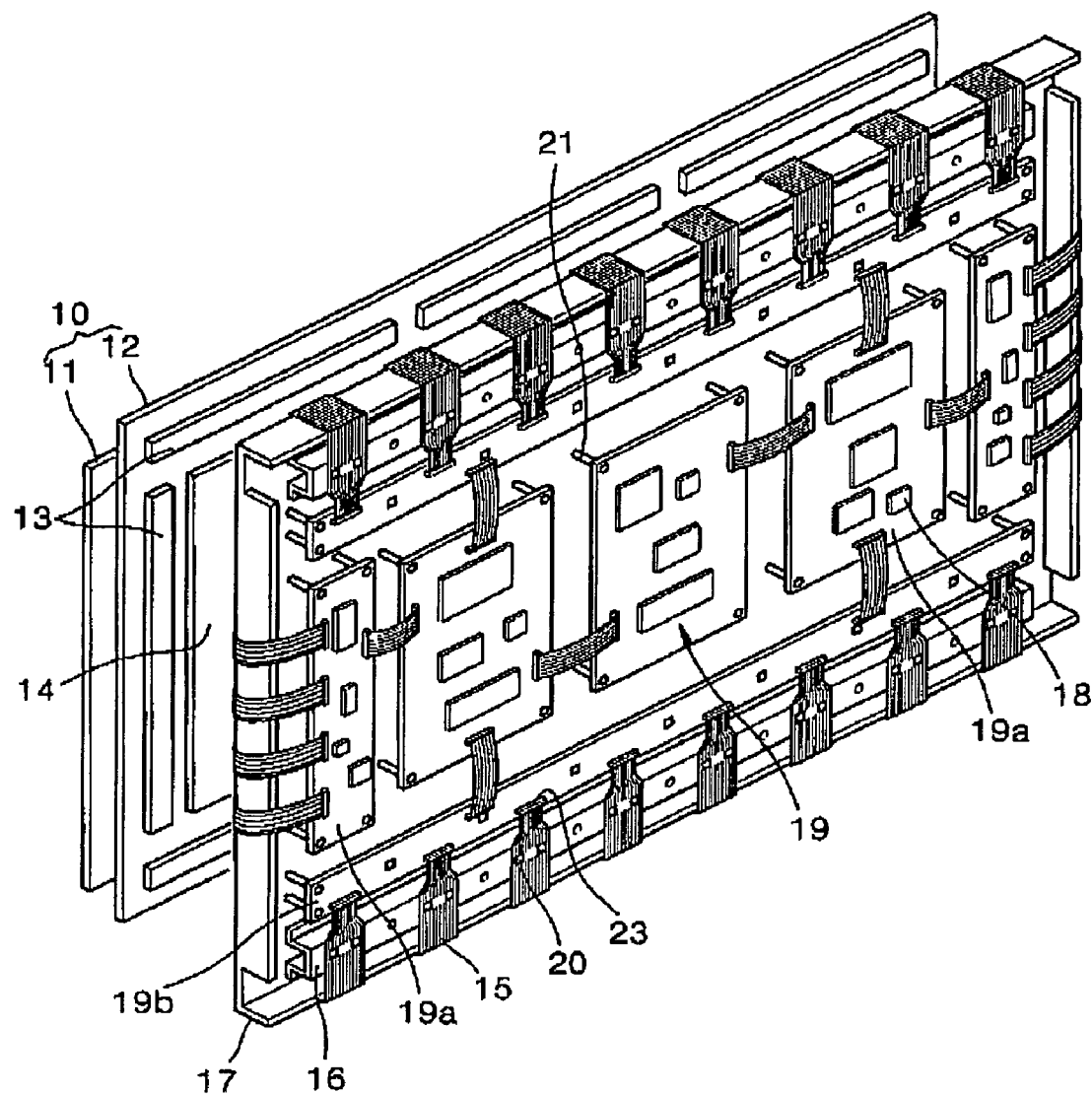
FIG. 1 is a perspective view showing a conventional plasma display device.
Figure 2:
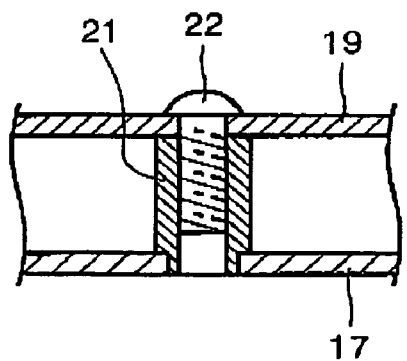
FIG. 2 is a cross-sectional view showing a printed board assembly coupled with a chassis base.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

A plasma display device according to embodiments of the present invention may have a similar structure as described with reference to FIG. 1. The plasma display device includes a PDP 10 that includes a front substrate 11 and a rear substrate 12, a chassis base 17 arranged behind a rear surface of the PDP 10, double sided tape 13 that couples the PDP 10 with the chassis base 17, a heat radiation sheet 14 arranged between the PDP 10 and the chassis base 17, studs and printed board assemblies mounted on a rear surface of the chassis base 17, and signal transmitting cables 15 that couple electrodes formed on the front substrate 11 and the rear substrate 12 with the printed board assemblies.

Figure 3:
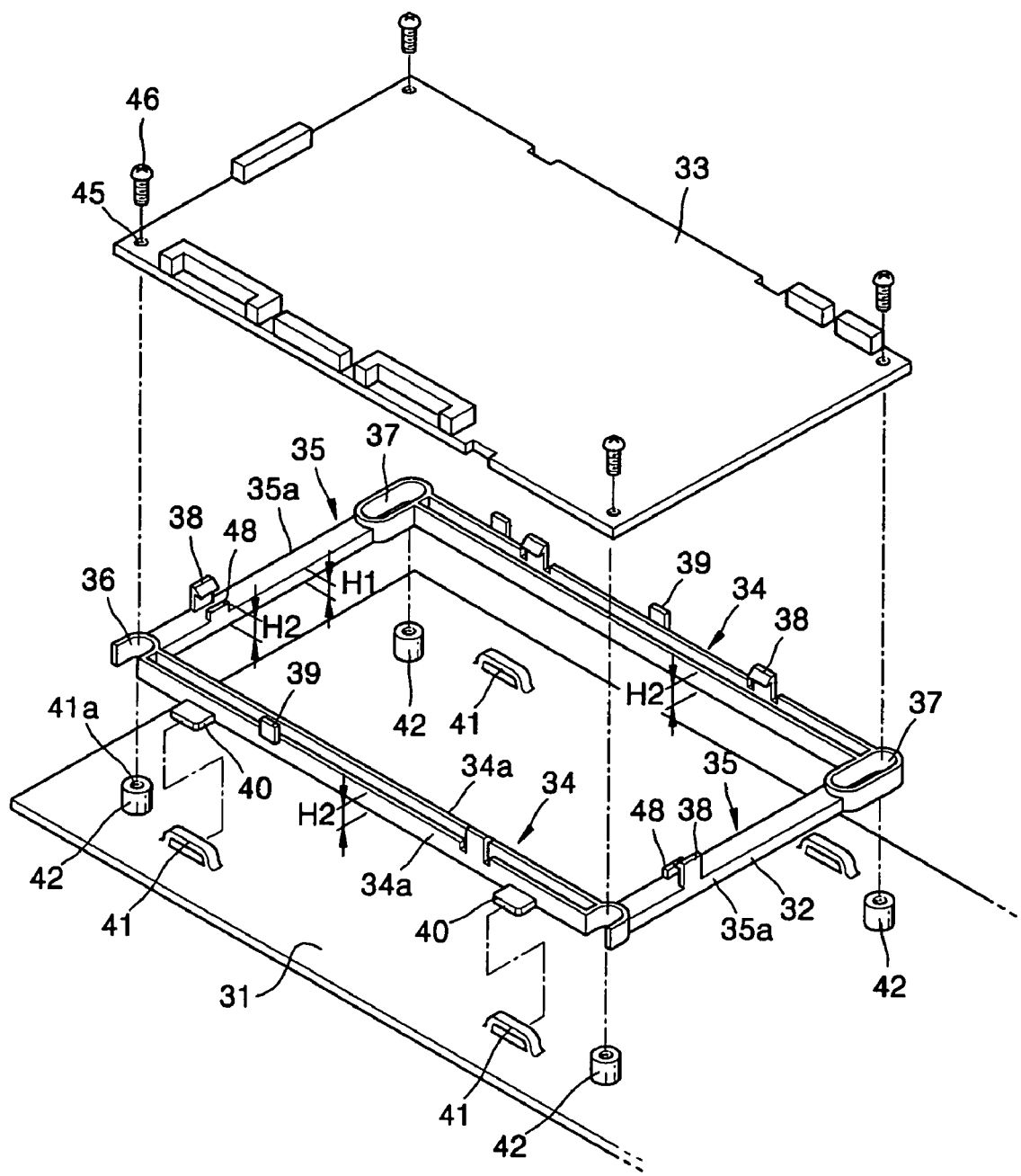
FIG. 3 is an exploded perspective view showing a printed board assembly and a frame bracket according to an exemplary embodiment of the present invention.

FIG. 3 is an exploded perspective view showing a printed board assembly and a frame bracket according to an exemplary embodiment of the present invention.

Referring to FIG. 3, a frame bracket 32 is coupled with a surface of a chassis base 31, and a printed board assembly 33 is coupled with the frame bracket 32.

The frame bracket 32 includes a pair of long side parts 34 and a pair of short side parts 35 extending along edges of the printed board assembly 33. The printed board assembly 33 may be formed in various shapes, and the long side parts 34 and the short side parts 35 may be varied according to the printed board assembly's shape. A long side part 34 includes a pair of wall parts 34a extending substantially parallel with each other, and a lower surface of the printed board assembly 33 is supported by upper surfaces of the wall parts 34a. The short side parts 35 include wall parts 35a, which are formed as one body. Upper surfaces of the short side parts 35 are spaced apart from the lower surface of the printed board assembly 33. That is, the height H1 of the short side parts 35 is less than the height H2 of the long side parts 34. Accordingly, gaps formed between the wall parts 35a and the printed board assembly 33 may act as paths for dissipating heat.

One or more hooks 38 may be formed on the long side parts 34 and the short side parts 35. The hooks 38 fix the printed board assembly 33 by hooking the upper surface of the printed board assembly 33 when the printed board assembly 33 is supported on an upper surface of the frame bracket 32. The hooks 38 may be integrally formed with the long side parts 34 and/or the short side parts 35.

A guide 39 is formed on the long side parts 34 to guide a side surface of the printed board assembly 33 when the printed board assembly 33 is supported on an upper surface of the wall parts 34a. The guide 39 may be formed in one body on a side surface of an external wall of the pair of wall parts 34a, and it may contact the side surface of the printed board assembly 33.

A supporting part 48 may be formed on the short side parts 35. An upper surface of the supporting part 48 may contact the lower surface of the printed board assembly 33. The supporting part 48 may prevent sagging due to the gaps formed between upper surfaces of the short side parts 35 and the lower surface of the printed board assembly 33.

An open stud groove 36 and a closed stud groove 37 may be formed in the frame bracket 32 to connect a long side part 34 and a short side part 35. The open stud groove 36 has a rounded surface with one side thereof open, and the rounded surface corresponds to an outer circumference of a cylinder of the stud 42. The stud 42 may be arranged in the stud groove 36, and the outer surface of the stud 42 may contact an inner surface of the open stud groove 36. When the stud 42 is inserted into the closed stud groove 37, an outer surface of the stud 42 may contact an inner surface of the closed stud groove 37, which includes rounded surfaces on both ends and straight surfaces extending between the rounded surfaces. The rounded surface of the closed stud groove 37 is formed to correspond to the outer surface of the stud 42. The stud 42 may be arranged along the longitudinal direction of the closed stud groove 37 according to the location of the stud 42 fixed on the chassis base 31. Upper surfaces of the open stud groove 36 and the closed stud groove 37 may contact the lower surface of the printed board assembly 33.

As shown in FIG. 3, a protrusion part 40 is formed on the wall part 34a of the long side part 34. The protrusion part 40 protrudes a predetermined distance from an outer lower surface of the wall part 34a. The frame bracket 32 may be coupled with the chassis base 31 by inserting the protrusion part 40 into an inner side of an inserting part 41 formed in the chassis base 31.

Figure 4:
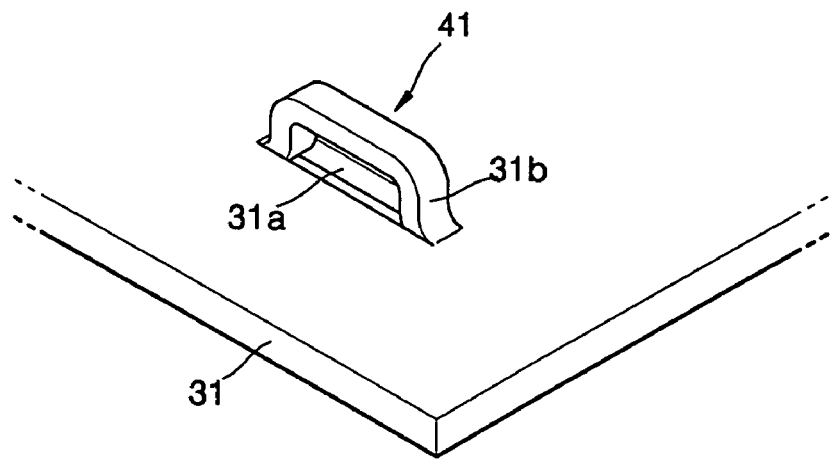
FIG. 4 is a magnified perspective view showing a portion of a main chassis base of FIG. 3.

FIG. 4 is an enlarged perspective view showing the inserting part 41 of FIG. 3.

Referring to FIG. 4, a cut part 31a is formed by cutting a portion of the chassis base 31, and a rounded part 31b is formed by plastic deformation of a portion of the chassis base 31 pushed upward from the cut part 31a. Hence, the frame bracket's protrusion part 40 may be inserted into the inserting part 41 formed by the rounded part 31b.

Referring back to FIG. 3, the stud 42 is fixed on the chassis base 31 and arranged in the open stud groove 36 or the closed stud groove 37. Upper surfaces of the studs 42 may contact the lower surface of the printed board assembly 33 together with upper surfaces of the stud grooves 36 and 37. Screws 46 are coupled to screw holes 41a formed in the studs 42 by inserting the screws 46 through holes 45 in the printed board assembly 33, thereby fixing the printed board assembly 33.

Figure 5:
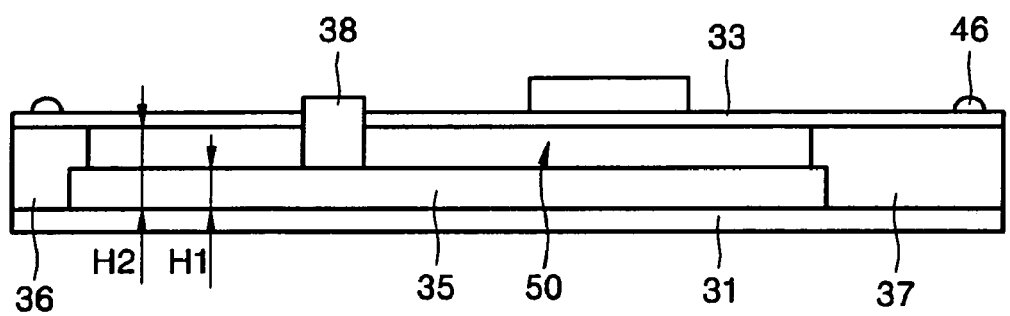
FIG. 5 is a side view of a printed board assembly and a frame bracket according to an exemplary embodiment of the present invention.

FIG. 5 is a side view showing a printed board assembly coupled with a frame bracket.

Referring to FIG. 5, the printed board assembly 33 is supported by upper surfaces of the open stud groove 36 and the closed stud groove 37, and also by supporting parts 48 (see FIG. 3 and FIG. 6) formed as part of the short side parts 35. A gap 50 is formed between the lower surface of the printed board assembly 33 and the short side part 35 since the short side part 35 is shorter than the stud grooves 36 and 37. Air flowing through the gap 50 may prevent over heating of the space formed by the printed board assembly 33, the chassis base 31, and the frame bracket 32.

Figure 6:
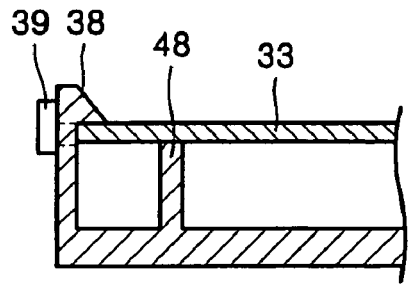
FIG. 6 is a cross-sectional view showing a supporting part and a hook of a frame bracket according to an exemplary embodiment of the present invention.

FIG. 6 is a cross-sectional view showing a structure of a supporting part and a hook of a frame bracket according to an exemplary embodiment of the present invention.

Referring to FIG. 6, hooks 38 fasten an upper surface of the printed board assembly 33, and upper surfaces of the supporting parts 48 may contact the lower surface of the printed board assembly 33. Therefore, the hooks 38 and the supporting parts 48 fix edge portions of the printed board assembly 33.

As described above, the assembling of the printed board assembly 33 to the chassis base 31 through the frame bracket 32 may be understood by referring to FIG. 3, FIG. 4, FIG. 5 and FIG. 6. The frame bracket 32 is coupled with the chassis base 31 by inserting the protrusion part 40 into the inserting part 41 and arranging the studs 42 in the open stud grooves 36 and the closed stud grooves 37. The printed board assembly 33 is coupled to the frame bracket 32 by being guided by the guide part 39. Upper surfaces of the wall parts 34a of the long side parts 34, upper surfaces of the open stud groove 36 and the closed stud groove 37, upper surfaces of the studs 42, and upper surfaces of the supporting parts 48 support the lower surface of the printed board assembly 33. Also, the hooks 38 fix the printed board assembly 33 by hooking the upper surface of the printed board assembly 33. The printed board assembly 33 may be fixed by inserting the screws 46 through the through holes of the printed board assembly 33 and screwing the screws 46 into the screw holes 41a in the studs 42.

A frame bracket for coupling a printed board assembly with a chassis base according to exemplary embodiments of the present invention, and a plasma display device having the same, may couple a printed board assembly with a chassis base and may facilitate the coupling by using fewer studs and screws. Also, gaps between the frame bracket and the printed board assembly may prevent overheating, and the frame bracket's structure may reduce vibration and noise caused by reflected sound.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A frame bracket for a printed board assembly, comprising:
   a pair of long side parts, each long side part comprising a wall part that contacts a lower surface of the printed board assembly;
   a pair of short side parts, each short side part forming a gap with the lower surface of
   the printed board assembly and extending substantially perpendicular to the long side parts; a first stud groove connecting a first long side part with a first short side part; and
   a protrusion part protruding from an outer, lower surface of a long side part or a short side part; and
   a second stud groove, the second stud groove connecting the first long side part with a second short side part,
   wherein the first stud groove comprises an open stud groove,
   wherein the second stud groove comprises a closed stud groove, and
   wherein the open stud groove comprises an end with a rounded surface and an opening opposing the end, and the closed stud groove comprises two ends formed with rounded surfaces and straight surfaces extending between the two ends.

2. The frame bracket of claim 1, further comprising:
   hooks extending upward from the long side parts or the short side parts, the hooks for fastening the printed board assembly.

3. The frame bracket of claim 1, wherein the long side part comprises a guide for guiding a side surface of the printed board assembly by contacting the side surface of the printed board assembly.

4. The frame bracket of claim 1, wherein the short side part comprises a supporting part contacting the lower surface of the printed board assembly.

5. A plasma display device, comprising:
   a plasma display panel;
   a chassis base coupled with a rear surface of the plasma display panel;
   a frame bracket; and
   a printed board assembly electrically coupled with the plasma display panel and mounted on the frame bracket,
   wherein the frame bracket comprises:
   a pair of long side parts, each long side part comprising a wall part that contacts a lower surface of the printed board assembly;
   a pair of short side parts, each short side part forming a gap with the lower surface of the printed board assembly and extending substantially perpendicular to the long side parts;
   a first stud groove connecting a first long side part with a first short side part, a first stud fixed on the chassis base being arranged in the first stud groove;
   a protrusion part protruding from an outer, lower surface of a long side part or a short side part and arranged in an inserting part formed on the chassis base; and
   a second stud groove, the second stud groove connecting the first long side part with a second short side part, a second stud fixed on the chassis base being arranged in the second stud groove,
   wherein the first stud groove comprises an open stud groove,
   wherein the second stud groove comprises a closed stud groove, and
   wherein the open stud groove comprises an end with a rounded surface and an opening opposing the end, and the closed stud groove comprises two ends formed with rounded surfaces and straight surfaces extending between the two ends.

6. The plasma display device of claim 5, further comprising:
   hooks extending upward from the long side parts or the short side parts, the hooks for fastening the printed board assembly.

7. The plasma display device of claim 5,
   wherein the end of the open stud groove corresponds to an outer surface of the first stud, and the two ends of the closed stud groove correspond to an outer surface of the second stud.

8. The plasma display device of claim 5, wherein the long side part comprises a guide for guiding a side surface of the printed board assembly by contacting the side surface of the printed board assembly.

9. The plasma display device of claim 5, wherein the short side part comprises a supporting part contacting the lower surface of the printed board assembly.

10. The plasma display device of claim 5, wherein the inserting part of the chassis base comprises a plastically deformed portion of the chassis base.

* * * * *